(12) United States Patent
Santolaria et al.

(10) Patent No.: US 12,125,767 B2
(45) Date of Patent: Oct. 22, 2024

(54) CLAMPING ELEMENT AND METHOD FOR PRODUCING A POWER SEMICONDUCTOR DEVICE

(71) Applicant: HITACHI ENERGY LTD, Zürich (CH)

(72) Inventors: Lluis Santolaria, Olten (CH); Dominik Truessel, Bremgarten (CH); Harald Beyer, Lenzburg (CH)

(73) Assignee: HITACHI ENERGY LTD, Zürich (CH)

( * ) Notice: Subject to any disclaimer, the term of this patent is extended or adjusted under 35 U.S.C. 154(b) by 0 days.

(21) Appl. No.: 18/564,532

(22) PCT Filed: Apr. 20, 2022

(86) PCT No.: PCT/EP2022/060370
§ 371 (c)(1),
(2) Date: Nov. 27, 2023

(87) PCT Pub. No.: WO2022/248126
PCT Pub. Date: Dec. 1, 2022

(65) Prior Publication Data
US 2024/0266250 A1    Aug. 8, 2024

(30) Foreign Application Priority Data
May 28, 2021    (EP) .................... 21176571

(51) Int. Cl.
*H01L 23/40* (2006.01)
*H01L 21/48* (2006.01)
(52) U.S. Cl.
CPC ...... *H01L 23/4006* (2013.01); *H01L 21/4871* (2013.01); *H01L 2023/4087* (2013.01)

(58) Field of Classification Search
CPC .. H01L 23/40–4093; H01L 23/42–4338; F28F 2275/00–22
See application file for complete search history.

(56) References Cited

U.S. PATENT DOCUMENTS

| 2020/0365484 | A1  | 11/2020 | Schnack et al. |
| 2021/0233831 | A1* | 7/2021  | Maleki ................ H01L 23/3171 |

FOREIGN PATENT DOCUMENTS

| CN | 103037658 A | 4/2013 |
| CN | 109997223 A | 7/2019 |

(Continued)

OTHER PUBLICATIONS

International Search Report and Written Opinion for corresponding International Application No. PCT/EP2022/060370, mailed Sep. 6, 2022. 13 Pages.

(Continued)

*Primary Examiner* — Laura M Menz
*Assistant Examiner* — Candice Chan
(74) *Attorney, Agent, or Firm* — Procopio, Cory, Hargreaves & Savitch LLP

(57) ABSTRACT

A clamping element (9) is specified configured to be pressed to a baseplate (2) of at least one power semiconductor module (1) comprising a mold (4), comprising —at least one contact area (10) being configured to be in direct contact to at least one clamping area (7) of the baseplate (2) being free of the mold (4), and —at least one recess (11) provided in the baseplate, wherein —the recess (11) and the contact area (10) are configured to face the baseplate. Further, a method for producing a power semiconductor device is specified.

14 Claims, 4 Drawing Sheets

(56) References Cited

FOREIGN PATENT DOCUMENTS

Figure 1:
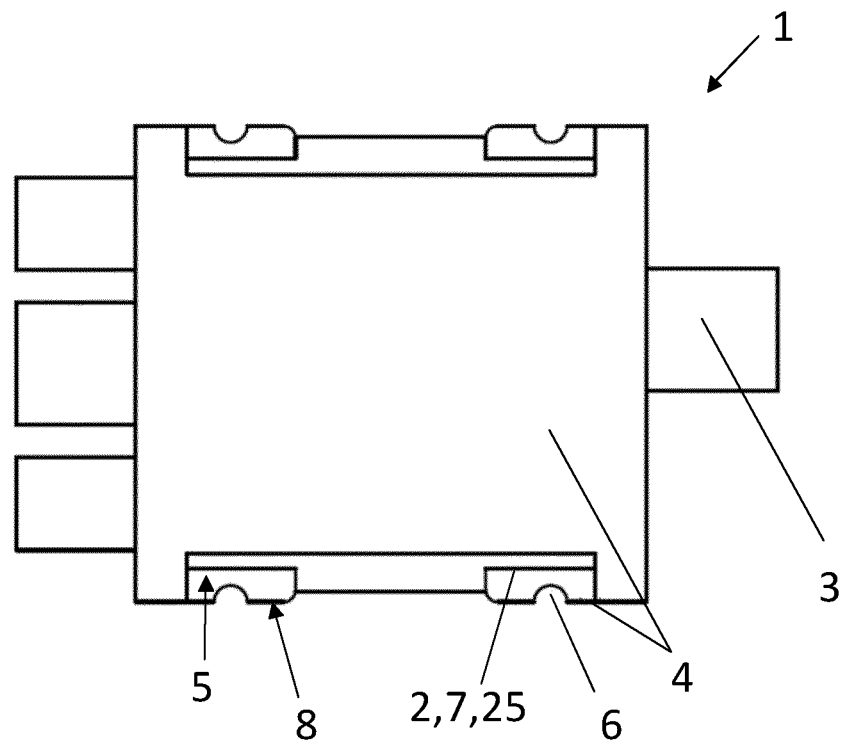

| | | |
|---|---|---|
| CN | 111095550 A | 5/2020 |
| CN | 111261601 A | 6/2020 |
| CN | 111900135 A | 11/2020 |
| DE | 202015006897 U1 | 11/2015 |
| DE | 102017218875 A1 | 4/2019 |
| DE | 102019200142 A1 | 7/2020 |
| DE | 102019200143 A1 | 7/2020 |
| EP | 3859774 A1 | 8/2021 |
| JP | 2000-82774 A | 3/2000 |
| JP | 2005-302886 A | 10/2005 |
| JP | 2008270295 A | 11/2008 |
| JP | 2013222870 A | 10/2013 |
| JP | 2014-116546 A | 6/2014 |
| WO | 2013/145619 A1 | 10/2013 |

OTHER PUBLICATIONS

Communication under Rule 71(3) EPC for the corresponding EP application 21 176 571.4 dated Aug. 21, 2023, 39 pages.

* cited by examiner

CLAMPING ELEMENT AND METHOD FOR PRODUCING A POWER SEMICONDUCTOR DEVICE

The present application is a national stage entry of International Patent Application No. PCT/EP2022/060370, filed on Apr. 20, 2022, which claims priority to European Patent Application No. 21176571.4, filed on May 28, 2021, the contents of which are hereby incorporated herein by reference as if set forth in full.

Embodiments of the disclosure relate to a clamping element, by which a mounting of a power semiconductor module is improved. Further embodiments of the disclosure relate to a method for producing a power semiconductor device.

This is achieved by the subject-matter of the independent claims. Further embodiments are evident from the dependent claims and the following description.

The first aspect of the invention relates to a clamping element configured to be pressed to a baseplate of at least one power semiconductor module comprising a mold.

The term "power" herein and in the following, for example, refers to power semiconductor modules, power semiconductor devices and/or semiconductor chips adapted for processing voltages and currents of more than 100 V and/or more than 10 A.

The power semiconductor module, for example, comprises a main plane of extension. Lateral directions are aligned parallel to the main plane of extension and a vertical direction is aligned perpendicular to the main plane of extension.

Exemplarily, the power semiconductor module comprises at least one semiconductor chip, which is based, for example, on silicon or silicon carbide. The at least one semiconductor chip is, for example an insulated-gate bipolar transistor or a metal-oxide-semiconductor field-effect transistor. The at least one semiconductor chip is, for example, formed as a diode and/or a switch. Alternatively, the at least one semiconductor chip is a discrete or passive device.

The power semiconductor module comprises, for example, the baseplate. For example, the at least one semiconductor chip is arranged on the baseplate. For example, the at least one semiconductor chip is mounted to a substrate, which is mounted to the baseplate. The baseplate extends exemplarily in lateral directions. The baseplate can comprise or consist of copper, aluminium, zinc, steel or a corresponding alloy. For example the baseplate comprises an aluminum silicon carbide or a magnesium silicon carbide. Alternatively, the baseplate is an insulated metal substrate with a resin isolating layer.

Alternatively, the baseplate is formed as the substrate to which the semiconductor chip is mounted.

For example, a portion being exposed from the mold can be an exposed portion of a metal block besides the substrate or the baseplate.

Additionally, the power semiconductor module comprises, for example, the mold. The mold is arranged, for example, on the baseplate and the at least one semiconductor chip. For example, the at least one semiconductor chip is completely encapsulated, i.e. three-dimensionally encapsulated, by the mold and the baseplate.

For example, the mold compound is in direct contact to the baseplate and the at least one semiconductor chip. The mold compound exemplarily comprise or consists of a thermoset material or a thermoplastic material. The mold compound exemplarily comprise or consists of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles. The mold compound comprises or consists of an epoxy mold compound, exemplarily an epoxy resin.

The baseplate comprises, for example, at least one opening in an edge region of the baseplate. The opening extends exemplarily completely through the baseplate in vertical direction. The opening is formed, for example, by a notch of the side surface of the baseplate. For example, the opening has the form of a semicircle in plan view.

For example, the mold is also arranged on the at least one side surface of the baseplate. The at least one side surface, exemplarily all side surfaces, of the baseplate are covered by the mold. This is to say also the side surface of the baseplate in the region of the opening is exemplarily completely covered by the mold.

For example, the mold is applied on the baseplate by a molding process, such that the mold is configured as an encapsulation of the power semiconductor module. The molding process comprises, inter alia, a die casting method, for example. Exemplarily, during such a method, an arrangement comprising the baseplate and the at least one semiconductor chip is brought into a mold tool made from an upper part and a lower part. A tight sealing of the mold tool is, for example, possible between the upper part and the lower part, but a proper sealing between side surfaces of the baseplate and the mold tool is not achievable due to the lack of exposing pressure in the direction of the side surfaces of the baseplate and due to tolerances in the dimensions of the baseplate as well as a misalignment of the baseplate. Thus, for example, a covering of the at least one side surface of the baseplate in the region of the opening cannot be avoided or is produced with defined thickness, if cannot be avoided.

In addition, the power semiconductor module can exemplarily comprise cooling structures. For example, the cooling structures are arranged on the baseplate. The cooling structures are exemplarily arranged on a bottom surface of the baseplate facing away from a top surface on which the at least one semiconductor chip is arranged. Alternatively, the cooling structures are formed in a cooler, on which the power semiconductor module is to be mounted.

For example, the cooling structures are formed from pin fins. For example, the pin fins are arranged on the bottom surface of the baseplate. The pin fins are formed, for example, from the same material as the baseplate such as copper. For example, each pin fin is formed from a pillar, wherein a tip of each pin fin extends in vertical direction facing away from the baseplate. For example, all of the pin fins have a common direction of extension being parallel to the vertical direction. For example, the cooling structures are formed integrally with one another.

According to this embodiment, the clamping element comprises at least one contact area being configured to be in direct contact to at least one clamping area of the baseplate, which is free of the mold. For example, the mold has a recessed part in the edge region of the baseplate. In this recessed part, the baseplate is, for example, at least partially free of the mold and can be freely accessible from the outside. For example, in the recessed part, the baseplate is free of the mold. For example, the top surface of the baseplate is free of the mold and thereby forming the contact area. The part of the baseplate being free of the mold is the clamping area configured to be in direct contact to the clamping element.

For example, the clamping element comprises the contact area, which is configured to be pressed to the clamping area of the baseplate. For example, the contact area is arranged in an edge region of the clamping element.

Exemplarily, the clamping element extends along a main extension direction along one of the lateral directions. For example, also the contact area extends along the main extension direction. In addition, the contact area exemplarily has a first length along the main extension direction. Alternatively, the contact area extends along lateral directions different than the main extension direction.

According to this embodiment, the clamping element comprises at least one recess provided in the baseplate. The recess is provided exemplarily on the same main surface of the clamping element, where the contact area is arranged. The recess does not penetrate the clamping element completely, for example.

For example, the recess extends at least partially along the main extension direction. Exemplarily, the recess has a second length along the main extension direction. The second length of the recess is exemplarily as large as the first length of the contact area. For example, the second length of the recess is larger than the first length of the contact area. This is to say that the recess projects beyond the contact area in the main extension direction.

According to this embodiment, the recess and the contact area are configured to face the baseplate. This is to say that if the contact area is in direct contact to the clamping area, the clamping element in the region of the recess is exemplarily not in direct contact to the mold. For example, the clamping element in the region of the recess is spaced apart in vertical direction from the mold being arranged on the side surface of the baseplate.

For example, the recess penetrates the clamping element only partially in vertical direction. For example, the recess has an extension in vertical direction of at least 0.05 mm to at most 0.8 mm, for example 0.3 mm.

Exemplarily, due to the recess, the clamping element is spaced apart in vertical direction, as well as in lateral directions, from the mold being arranged on the side surface of the baseplate. Furthermore, the clamping element is exemplarily spaced apart in lateral directions from the mold being arranged on the top surface of the baseplate. This is to say that the clamping element is not in direct contact to the mold at any place, for example.

In summary, such a clamping element can provide, inter alia, the following advantages. Damage of the mold adjacent to the clamping areas, i.e. on the side surface of the baseplate, due to clamping forces can be prevented.

This improves the acceptance of a customer and decreases the cost for a power semiconductor device, wherein a power semiconductor module is mounted on a cooler with the help of such a clamping element. This is to say by using such a clamping element with a recess, a yield can be increased and failure during mounting or even in service can be avoided. Further, the mold remains exemplarily undamaged after mounting. Thus, a spreading out of particles of the mold and corresponding generation of particle impurities in the environment of the device are prevented.

According to at least one embodiment, the clamping element comprises at least one hole. The at least one hole is exemplarily configured for receiving a screw. For example, the hole penetrates the clamping element completely in vertical direction. For example, the hole has the form of a circle in plan view. Exemplarily the opening of the baseplate is configured for receiving the same screw at least partly. This is to say that when the clamping element is arranged on the baseplate, the opening and the hole exemplarily overlap with one another in lateral directions in plan view, for example.

Alternatively, the clamping element does not comprise a hole, for example. In this case, the clamping element is configured to be pressed to the baseplate by a spring mechanism, for example by a spring or a clamp.

According at least one embodiment, the clamping element further comprises at least one hole, and the at least one recess is provided between the at least one hole and the at least one contact area in lateral directions facing the baseplate. For example, the recess is directly adjacent to the hole and directly adjacent to the contact area. This is to say that the hole and the contact area are spatially separated in lateral directions. Exemplarily, the recess is provided between the contact area and other parts of the clamping element.

According to at least one embodiment of the clamping element, the at least one contact area is smaller than the at least one clamping area. Exemplarily, the clamping area and the contact area completely overlap with one another in lateral directions in plan view. For example, the dimensions of the clamping area in lateral directions are larger than the dimensions of the contact area. This is to say that a width and a length of the clamping area is larger than a width and a length of the contact area. Thus, it is ensured exemplarily, that the clamping element exclusively applies the pressure in vertical direction to the clamping area. Exemplarily, tolerance for a positioning and a slight movement in lateral directions is given by different sizes of the clamping area and the contact area. For example, a contact area can consist of several small areas separated by recesses. Nevertheless, the extensions the complete contact area are still smaller than the clamping area, for example.

According to at least one embodiment of the clamping element, a surface of the at least one contact area comprises a roughening. For example, the surface facing the baseplate of the contact area completely comprises the roughening. Due to such a roughening, a lateral movement of the power semiconductor module is prevented or at least reduced, when the clamping element is pressed with its contact area to the clamping area.

According to at least one embodiment of the clamping element, the roughening comprises protrusions being provided in a regular or non-regular manner. For example, the protrusions introduce a surface roughness Ra to the contact area being at least 5 µm and at most 100 µm. Exemplarily, the protrusions have an extension in vertical direction of at least 10 µm and at most 2 mm.

Exemplarily, if the protrusions are provided in a regular manner, the protrusions are arranged on grid points of a regular grid, such as a polygonal grid. If the protrusions are provided in a non-regular manner, the protrusions are randomly distributed over the contact area.

According to at least one embodiment of the clamping element, the protrusions have a round, a conical, a cubic or a pyramidal shape. For example, the shape of the protrusions is dependent on a production method thereof. Alternatively, the protrusions can be formed of any shape.

According to at least one embodiment of the clamping element, the at least one recess has a cross-sectional shape being round, rectangular, triangular or trapezoidal. For example, the shape of the recess is dependent on a production method thereof. If the recess is produced, for example, by a milling process, the recess can a cross-sectional shape being round. Alternatively, the recess can have any cross-sectional shape.

According to at least one embodiment of the clamping element, the clamping element is configured to connect the at least one power semiconductor module with a cooler or heatsink.

For example, the cooler comprises a cooling cavity, which is configured to receive a coolant, such as a gas or a liquid. The coolant is configured to flow in a flow direction within the cooling cavity from an inlet port to an outlet port.

The cooler is, for example, provided with at least one cut out. For example, the power semiconductor module is configured to be placed on the cooler such that the cooling structure can protrude through the cut out in the cooling cavity.

Alternatively the cooler is a closed cooler.

For example, the cooler is provided with more than one cut out. Exemplarily, the cut outs are provided in the cooler consecutively in the direction of the flow direction. In this case, a power semiconductor module is provided on each cut out.

Exemplarily, the cooler comprises a further opening. The further opening is formed, for example, as a screw thread. The further opening extends exemplarily solely partially through the cooler, exemplarily, through a cooler wall. For example, the further opening has the form of a circle in plan view. Exemplarily the further opening of the cooler is configured for receiving the same screw. This is to say that when the clamping element is arranged on the baseplate, the opening, the further opening and the hole exemplarily overlap with one another in lateral directions in plan view.

Exemplarily, the clamping element is configured to press the power semiconductor module in direction to the cooler. Thereby, the screw is exemplarily passed through the opening and the hole and then is screwed in into the further opening. Thus, the clamping element is exemplary screwed to the cooler and thereby fixing the power semiconductor module to the cooler in a mechanically stable manner.

According to at least one embodiment of the clamping element, the clamping element comprises a first part, a second part and a third part. Exemplarily, the first part, the second part and the third part each extends along the main extension direction. The first part, the second part and the third part are exemplarily formed integrally with one another.

According to at least one embodiment of the clamping element, the first part, the second part and the third part are provided on top of one another in vertical direction.

According to at least one embodiment of the clamping element, the second part protrudes beyond the third part in lateral directions.

According to at least one embodiment of the clamping element, the first part is in direct contact with the cooler. For example, a surface, i.e. the whole surface, of the first part facing the cooler is in direct contact with the cooler.

According to at least one embodiment of the clamping element, the at least one contact area is part of the second part.

According to at least one embodiment, the clamping element has at least two holes, at least two recesses and at least two contact areas configured to connect the at least one power semiconductor module with a cooler. Exemplary, in order to press the power semiconductor module on a cooler, one power semiconductor module is provided with two clamping elements, provided at two opposite sides of the power semiconductor module. This is to say, for example, two of the clamping elements are configured to press one power semiconductor module to the cooler, wherein between the cooler and the power semiconductor module a seal is arranged. The seal can comprise a flexible material being impermeable to a cooling medium.

For example, the two holes are spaced apart from one another along the main extension direction. Further, next to each hole exemplarily at least one contact area is provided. Between the two holes, the first part and the third part are provided. This is to say that the first part and the second part connect the second part, i.e. the at two contact areas, with one another.

For example, the first part faces the cooler and is in direct contact to the cooler. Such a direct contact can help to distribute forces, which emerge during screwing, over the whole clamping element, and providing a stopping function when screwing down the clamping element for a defined clamping force.

If there is only one hole, the hole is positioned in a center position in lateral directions in the clamping element.

According to at least one embodiment, the clamping element has at least two holes, at least two recesses at least two contact areas configured to connect at least two power semiconductor modules with a cooler. Directly neighbouring power semiconductor modules exemplarily share one clamping element.

In this embodiment, the first part is exemplarily formed as a wall extending in the main extension direction. For example, the wall is arranged on the second part and divides the second part in two equal parts along the main extension direction. Exemplarily, each part comprises a half of the hole, one recess and one contact area. For example, these elements are mirrored by the first part, i.e. the wall.

A second aspect of the invention relates to a method for producing a power semiconductor device. For example, the method comprises a clamping element as described herein above. Thus, all features disclosed in connection with the method are also disclosed in connection with the clamping element and vice versa.

According to this embodiment of the method, a cooler is provided.

According to this embodiment of the method, a power semiconductor module is provided comprising a baseplate and a mold, wherein at least one clamping area of the baseplate is free of the mold.

According to this embodiment of the method, a clamping element is provided as described herein above.

According to this embodiment of the method, the power semiconductor module is attached on the cooler by the clamping element such that the at least one contact area is pressed against the at least one clamping area.

According to at least one embodiment of the method, the baseplate comprises at least one opening, the cooler comprises at least one further opening and the at least one opening, the at least one further opening and the at least one hole overlap in lateral directions in plan view with one another.

The subject-matter of the disclosure will be explained in more detail in the following with reference to exemplary embodiments which are illustrated in the attached drawings.

FIG. 1 schematically shows sketch of a power semiconductor module.

Figure 2:
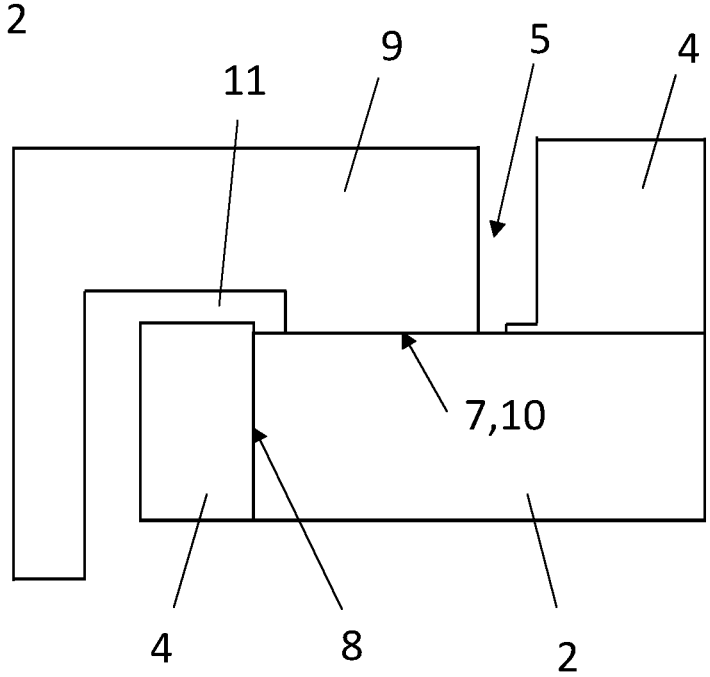

FIG. 2 schematically shows a sectional view of a clamping element according to an exemplary embodiment.

Figure 3:
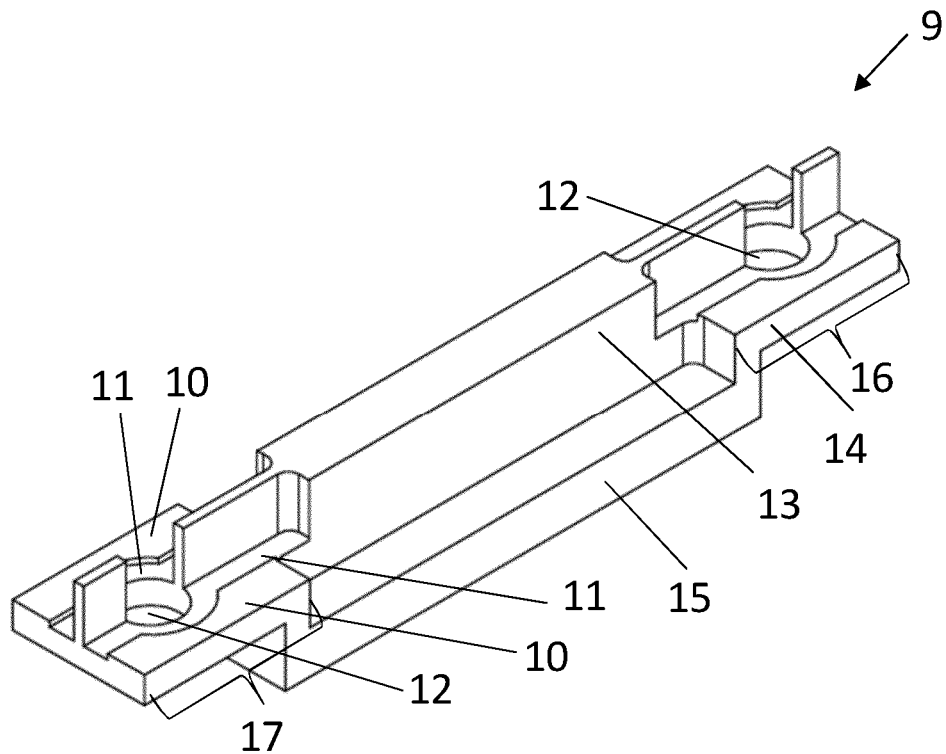
Figure 4:
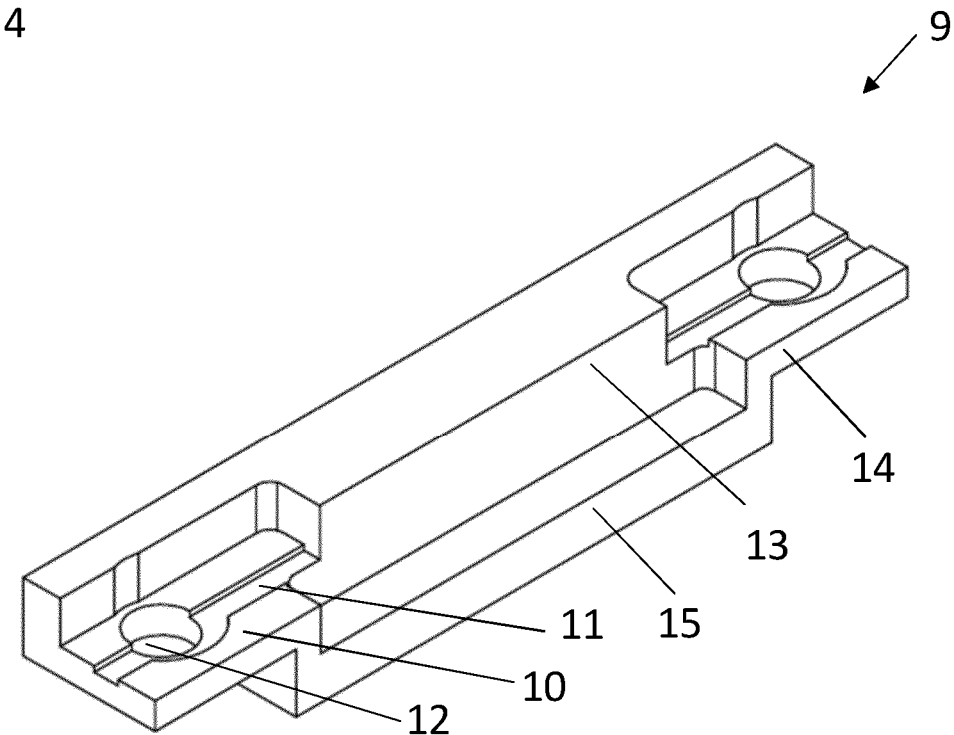

FIGS. 3 and 4 each schematically show a clamping element according to an exemplary embodiment.

Figure 5:
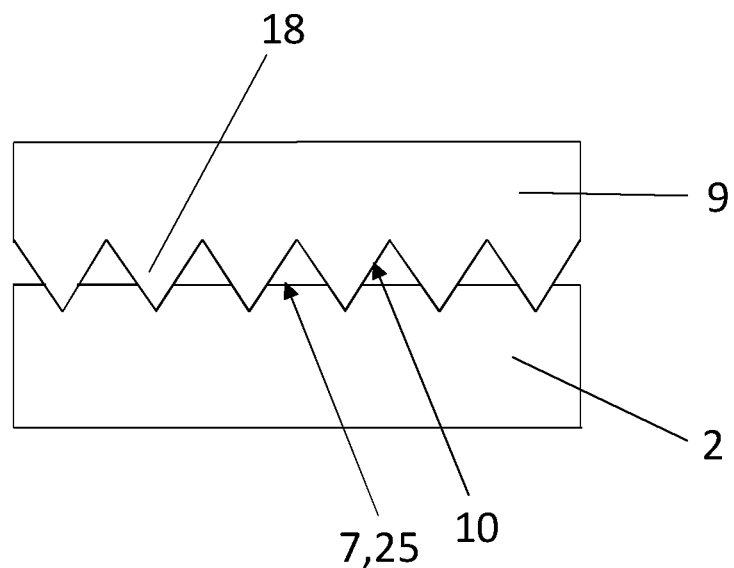

FIG. 5 schematically shows a contact area of a clamping element according to an exemplary embodiment.

Figure 6:
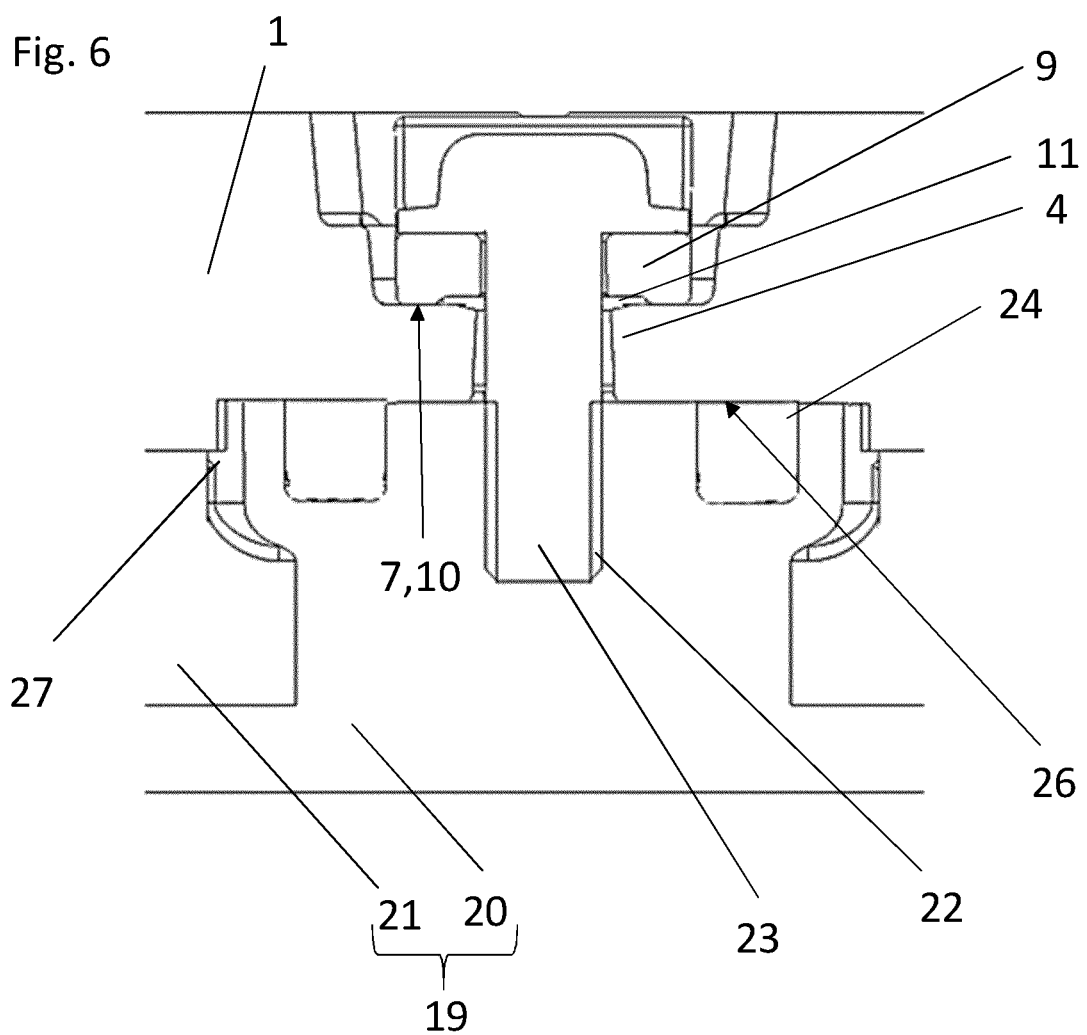
Figure 7:
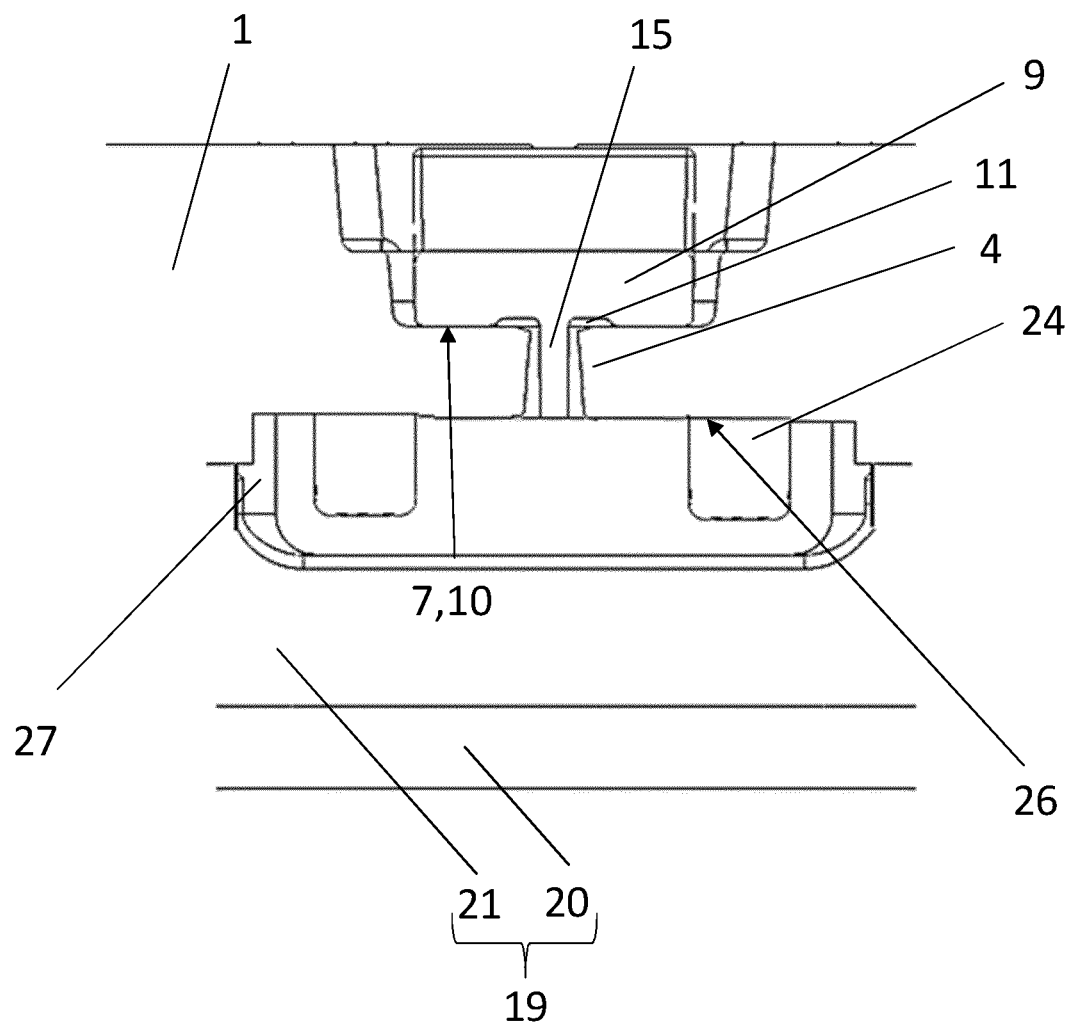

FIGS. 6 and 7 each shows a power semiconductor device with a clamping element according to an exemplary embodiment in cross-sectional view.

The reference symbols used in the drawings, and their meanings, are listed in summary form in the list of reference symbols. In principle, identical parts are provided with the same reference symbols in the figures.

The power semiconductor module 1 according FIG. 1 comprises, inter alia, a baseplate 2, on which at least one semiconductor chip (not shown here) is arranged. The at least one semiconductor chip can be energised by terminals. Further, the power semiconductor module 1 comprises a mold 4, which covers the at least one semiconductor chip and the baseplate 2. In addition, the terminals 3 are provided at least partially within the mold 4.

The mold 4 has a recessed part 5 in an edge region of the baseplate 2. In this recessed part 5, a top surface baseplate 2 is at least partially free of the mold 4 and thus can be freely accessible from the outside. Each part being free of the mold 4 in the edge region of the baseplate 2 is formed as a clamping area 7. In the clamping area 7, a top surface of the baseplate 2 is free of the mold 4. The clamping area 7 is surrounded by the mold 4 in lateral directions.

In this exemplary embodiment, the power semiconductor module 1 comprises four clamping areas 7. Further, two opposite edge regions of the baseplate 2 are provided with two of the clamping areas 7.

Further, the baseplate 2 comprises four openings 6. The two opposite edge regions of the baseplate 2 are provided with two of the openings 6. Each opening 6 is formed by a notch of a side surface of the baseplate 8 in the respective edge region, wherein the openings 6 each have the form of a semicircle in plan view. The openings 6 are arranged next to the clamping areas 7.

The mold 4 is also arranged on the side surface of the baseplate 8. This is to say also the side surface of the baseplate 8 in the region of the opening 6 is covered by the mold 4.

The clamping element 9 according FIG. 2 is configured to be pressed to a top surface of a baseplate 2 of at least one power semiconductor module 1 comprising a mold 4, e.g. according to FIG. 1. The sectional view of FIG. 2 is representative for a cut through the clamping element 9 and the baseplate 2 through the opening 6 of the baseplate 2. As already described in connection with FIG. 1, the side surface of the baseplate 8 is covered with the mold 4.

The clamping element 9 comprises a contact area 10 and a recess 11. The contact area 10 is configured to be in direct contact to the clamping area 7 of the baseplate 2, which is free of the mold 4. This is to say that the contact area 10 is configured to be pressed to the clamping area 7 of the baseplate 2. Thus, if the clamping element 9 is pressed down, the force applied on the baseplate 2 by the clamping element 9 exclusively acts on the clamping area 7.

The recess 11 penetrates the clamping element 9 only partially in vertical direction. Further, the recess 11 faces the baseplate 2. The recess 11 and the mold 4 on the side surface of the baseplate 8 are completely overlapping in lateral directions in plan view.

Due to the recess 11 in the clamping element 9, the clamping element 9 is not in direct or mechanical contact with the mold 4 arranged on the side surface of the baseplate 8. Thus, no force emanate from the clamping element 9 can act on the mold 4 arranged on the side surface of the baseplate 8.

Furthermore, the clamping element 9 is also spaced apart in lateral directions from the mold 4 being arranged on the top surface of the baseplate. This is to say that the clamping element 9 is not in direct contact with the mold 4 at any place.

The clamping element 9 according FIG. 3 comprises a first part 13, a second part 14 and a third part 15. The first part 13, the second part 14 and the third part 15 each extends along the main extension direction and are arranged on top of one another in vertical direction, in the order indicated. Further, the first part 13, the second part 14 and the third part 15 are formed from the same material in integral manner.

The clamping element 9, e.g. the second part 14, comprises two holes 12. Each of the holes 12 is configured for receiving a screw. Further, each of the holes 12 penetrates the clamping element 9 completely in vertical direction and have the form of a circle in plan view. The two holes 12 are spaced apart from one another along the main extension direction. One of the holes 12 is provided in a first end region 16 of the clamping element 9, e.g. the second part 14. The other one of the holes 12 is provided in a second end region 17 of the clamping element 9, e.g. the second part 14, being arranged opposite the first end region 16.

The first part 13 is formed as a wall extending in the main extension direction. The wall is arranged on the second part 14 and divides the second part 14 in two equal parts along the main extension direction. The wall is interrupted by the holes 12 within the second part 14.

Exemplarily, the wall acts as a mirror plane for the elements which are comprised in the second part 14. This is to say that each part of the second part 14 comprises a half of the first end region 16 of the second part 14, i.e. being divided along the mirror plane, and half of the second end region 17 of the second part 14, i.e. being divided along the mirror plane.

With respect to one end region and one part, the second part 14 comprises one of the contact areas 10. This contact area 10 is arranged next to the hole 12 and is spaced apart from the hole 12 by the recess 11 in lateral directions.

According to this exemplary embodiment, the clamping element 9, e.g. the second part 14, comprises four contact areas 10. In the first end region 16 two contact regions are provided in the second part 14. Further, in the second end region 17 also two contact regions are provided in the second part 14. The contact areas 10 of one end region are arranged opposite to one another next to the hole 12. As explained above, the contact areas 10 are each spaced apart from the hole 12 by a recess 11.

In sum, the clamping element 9 according to this exemplary embodiment comprises four recesses.

The wall between the first end region 16 and the second end region 17 of the second part 14 has a width being larger than a width of the wall being arranged on the second part 14.

The first part 13 and the third part 15 are configured to connect the first end region 16 and the second end region 17 of the second part 14 in a mechanically stable manner.

In this embodiment, the clamping element 9 is configured to press down two edge regions of adjacent power semiconductor modules 1. This is to say that the clamping element 9 according to this exemplary embodiment is provided between two adjacent power semiconductor modules 1. Alternatively, the clamping element 9 according to this exemplary embodiment can be provided for one power semiconductor module 1.

In contrast to the exemplary embodiment according to FIG. 3, the clamping element 9 according FIG. 4 is configured to press down one edge region of one power semiconductor module 1. In this exemplary embodiment, the clamping element 9 also comprises two holes 12 and two contact areas 10.

One of the two contact areas 10 is provided in the first end region 16 of the second part 14 next to one of the two holes 12. Further, the other one of the two contact areas 10 is provided in the second end region 17 of the second part 14 next to the other of the holes 12.

Opposite the contact areas 10, i.e. on the opposite side of the holes, the second part 14 comprises two parts having a same height than the contact areas 10. However, this parts are not in contact to the baseplate 2.

In this exemplary embodiment, the first part 13, e.g. the wall, is an end part of the clamp and does not divide the second part 14 into two parts.

The contact area 10 of the clamping element 9 according FIG. 5 comprises a roughening. A surface of the contact area 10 facing the baseplate 2 comprises the roughening. The roughening comprises protrusions 18 being provided in a regular manner. The protrusions 18 according to FIG. 5 have a pyramidal shape.

While pressing the clamping element 9 on the clamping area 7, the protrusions 18 can be pressed in the material of the baseplate 2 in vertical direction. Thus, an improved mechanical connection is achieved and preventing any lateral movement between clamp and module.

The power semiconductor device according FIG. 6 comprises two power semiconductor modules 1 according to FIG. 1 and a clamping element 9 according to FIG. 3 in cross sectional view. Further, the semiconductor module 1 is attached to a cooler 19 by the clamping element 9. Between the cooler 19 and the power semiconductor module 1 a seal 24 is arranged for leak tightness. Here, the seal 24 is compressed such that a sealing surface 26 is formed between the baseplate 2 and the cooler 19.

The cooler 19 comprises a cooler wall 20, which defines a cooling cavity 21. Further, the cooler 19 is provided with two cut outs 27, extending completely through the cooler wall 20. Each of the power semiconductor module 1 is placed on one of the cut outs 27.

The cooler 19 further comprises a further opening 22. The further opening 22 is formed, for example, as a screw thread. This is to say that a screw 23 can be screwed into the further opening 22. The further opening 22 extends solely partially through the cooler wall 20.

Each baseplate 2 comprises an opening 6 of the form of a semicircle in plan view. This is to say that adjacent openings 6 of the two power semiconductor modules 1 form an opening 6 having an oval form in plan view.

The openings 6 of the two power semiconductor modules 1, the further opening 22 of the cooler 19 and the hole 12 of the clamping element 9 overlap with one another in lateral directions in plan view. The openings 6 of the two power semiconductor modules 1, the further opening 22 of the cooler 19 and the hole 12 of the clamping element 9 each are configured for receiving the same screw 23.

If the screw 23 is tightened, the contact areas 10 of the clamping element 9 presses the clamping areas 7 of power semiconductor modules 1 in direction to the cooler 19. Due to the recess 11 within the clamping element 9, the clamping element 9 is not in direct contact to the mold 4 arranged on the side surface of the baseplate 8 and thus a damage of the mold 4 is prevented. The first part provides a mechanical stop of the tightening of the screw providing a reproducible clamping force.

The power semiconductor device according FIG. 7 shows a sectional view spaced apart from the opening 6, the further opening 22 and the hole 12. The sectional view extends, for example, between two holes.

Also here, the recess 11 within the clamping element 9 prevents a direct contact of the clamping element 9 and the mold 4 arranged on the side surface of the baseplate 8.

Further, the surface of the first element facing the cooler 19 is in direct contact to the cooler 19. Due to the direct contact, emerging forces, which emerge during screwing, can be distributed over the whole clamping element 9.

Also the first part 13 acts as a stopper to provide reproducible forces.

REFERENCE SIGNS LIST 1 power semiconductor module
2 baseplate
3 terminal
4 mold
5 recessed part
6 opening
7 clamping area
8 side surface of the baseplate
9 clamping element
10 contact area
11 recess
12 hole
13 first part
14 second part
15 third part
16 first end region
17 second end region
18 protrusion
19 cooler
20 cooler wall
21 cooling cavity
22 further opening
23 screw
24 seal
25 top surface
26 sealing surface
27 cut out

The invention claimed is:

1. A clamping element configured to be pressed to a baseplate of at least one power semiconductor module comprising a mold, comprising
    at least two contact areas being configured to be in direct contact to at least one clamping area of the baseplate being free of the mold, and
    at least two recesses provided in the clamping element,
    at least two holes, wherein
    at least one recess and at least one contact area are configured to face the baseplate,
    the clamping element is configured to connect the at least one power semiconductor module with a cooler.

2. The clamping element according to claim 1, wherein at least one recess is provided between at least one hole and at least one contact area in lateral directions.

3. The clamping element according to claim 1, wherein at least one contact area is smaller than at least one clamping area.

4. The clamping element according to claim 1, wherein a surface of at least one contact area comprises a roughening.

5. The clamping element according to claim 4, wherein the roughening comprises protrusions being provided in a regular or non-regular manner.

6. The clamping element according to claim 5, wherein the protrusions have a round, a conical, a cubic or a pyramidal shape.

7. The clamping element according to claim 1, wherein at least one recess has a cross sectional shape being round, rectangular, triangular or trapezoidal.

8. The clamping element according to claim 1, wherein the clamping element is configured to connect the at least one power semiconductor module with a heatsink.

9. The clamping element according to claim 1, wherein
the clamping element comprises a first part, a second part and a third part,
the first part, the second part and the third part are provided on top of one another in vertical direction, and
the second part protrudes beyond the third part in lateral directions.

10. The clamping element according to claim 8, wherein the first part is in direct contact to the cooler.

11. The clamping element according to claim 9, wherein at least one contact area is part of the second part.

12. The clamping element according to claim 1, wherein the clamping element is configured to connect at least two power semiconductor modules with a cooler.

13. A method for producing a power semiconductor device, comprising:
providing a power semiconductor module comprising a baseplate and a mold, wherein at least one clamping area of the baseplate is free of the mold,
providing a cooler,
providing a clamping element according to claim 1,
attaching the power semiconductor module on the cooler by the clamping element such that at least one contact area is pressed to the at least one clamping area.

14. The method according to claim 13, wherein
the baseplate comprises at least one opening,
the cooler comprises at least one further opening,
the at least one opening, the at least one further opening and at least one hole overlap in plan view with one another.

* * * * *